(12) United States Patent
Danesh

(10) Patent No.: US 8,922,454 B2
(45) Date of Patent: Dec. 30, 2014

(54) INTEGRATED PHOTOVOLTAIC CELL AND RADIO-FREQUENCY ANTENNA

(76) Inventor: Mina Danesh, Dollard-des-Ormeaux (CA)

( * ) Notice: Subject to any disclaimer, the term of this patent is extended or adjusted under 35 U.S.C. 154(b) by 306 days.

(21) Appl. No.: 13/636,957

(22) PCT Filed: Mar. 18, 2011

(86) PCT No.: PCT/CA2011/000297
§ 371 (c)(1),
(2), (4) Date: Sep. 24, 2012

(87) PCT Pub. No.: WO2011/116463
PCT Pub. Date: Sep. 29, 2011

(65) Prior Publication Data
US 2013/0009851 A1 Jan. 10, 2013

Related U.S. Application Data

(60) Provisional application No. 61/316,919, filed on Mar. 24, 2010.

(51) Int. Cl.
*H01Q 1/00* (2006.01)
*H01Q 1/44* (2006.01)
*H01G 9/20* (2006.01)
*H01L 31/04* (2014.01)

(52) U.S. Cl.
CPC . *H01Q 1/44* (2013.01); *H01G 9/20* (2013.01); *H01L 31/04* (2013.01); *Y02E 10/50* (2013.01)
USPC .......................................... 343/904

(58) Field of Classification Search
CPC ......... H01Q 1/20; H01Q 9/0407; H01Q 1/00; H01G 7/06
USPC ......................................... 343/904, 907, 893
See application file for complete search history.

(56) References Cited

U.S. PATENT DOCUMENTS

| | | |
|---|---|---|
| 4,445,050 A | 4/1984 | Marks |
| 4,490,668 A | 12/1984 | Sterzer |
| 4,751,513 A | 6/1988 | Daryoush et al. |
| 5,666,127 A | 9/1997 | Kochiyama et al. |
| 5,986,618 A | 11/1999 | Aakula et al. |
| 6,087,991 A | 7/2000 | Kustas |
| 6,111,254 A | 8/2000 | Eden |

(Continued)

FOREIGN PATENT DOCUMENTS

| | | |
|---|---|---|
| EP | 1.575.124 | 9/2005 |
| JP | 2001-320217 | 11/2001 |
| WO | WO 01/71845 | 9/2001 |

OTHER PUBLICATIONS

International Search Report for International Application No. PCT/CA/2011/000297 mailed Apr. 28, 2011.

*Primary Examiner* — Huedung Mancuso
(74) *Attorney, Agent, or Firm* — Pearl Cohen Zedek Latzer Baratz LLP

(57) ABSTRACT

An integrated photovoltaic cell and RF antenna assembly is disclosed, the assembly comprising a photovoltaic cell and at least two horizontal portions of conductive material, each of the at least two horizontal portions of conductive material being secured under the photovoltaic cell, wherein two of the at least two horizontal portions are used for providing an electrical potential difference and the RF antenna is provided using the photovoltaic cell and at least one of the at least two horizontal portions of conductive material.

19 Claims, 15 Drawing Sheets

(56) References Cited

U.S. PATENT DOCUMENTS

| | | |
|---|---|---|
| 6,195,065 B1 * | 2/2001 | Hung et al. .................... 343/876 |
| 6,394,395 B1 | 5/2002 | Poturalski |
| 6,395,971 B1 | 5/2002 | Bendel et al. |
| 6,590,150 B1 | 7/2003 | Kiefer |
| 7,129,493 B2 | 10/2006 | Garner et al. |
| 7,362,273 B2 | 4/2008 | Sarehraz et al. |
| 7,456,803 B1 * | 11/2008 | Sievenpiper ................. 343/909 |
| 7,612,735 B2 * | 11/2009 | Essig et al. ................... 343/915 |
| 8,665,161 B2 * | 3/2014 | Parsche ......................... 343/702 |
| 2007/0107766 A1 | 5/2007 | Langley, II et al. |
| 2007/0240757 A1 | 10/2007 | Ren et al. |
| 2008/0055177 A1 | 3/2008 | Dixon |
| 2008/0087326 A1 | 4/2008 | Scholes et al. |
| 2009/0026579 A1 | 1/2009 | Silver et al. |
| 2010/0032009 A1 | 2/2010 | Skryabin |
| 2013/0249771 A1 * | 9/2013 | Kotter et al. .................. 343/893 |

* cited by examiner

INTEGRATED PHOTOVOLTAIC CELL AND RADIO-FREQUENCY ANTENNA

CROSS-REFERENCE TO RELATED APPLICATIONS

This application is a National Phase Application of PCT International Application No. PCT/CA/2011/000297, International Filing Date Mar. 18, 2011, claims priority of U.S. Patent Application No. 61/316,919, entitled "Integrated Photovoltaic Cell and Radio-Frequency Antenna" which was filed on Mar. 24, 2010, the specification of which is hereby incorporated by reference.

CROSS-REFERENCE TO RELATED APPLICATIONS

The application claims priority of U.S. Patent Application No. 61/316,919, entitled "Integrated Photovoltaic Cell and Radio-Frequency Antenna" that was filed on Mar. 24, 2010, the specification of which is hereby incorporated by reference.

FIELD OF THE INVENTION

The invention relates to electronics components. More precisely, this invention pertains to an integrated photovoltaic (PV) cell and radio-frequency (RF) antenna assembly for the conversion of photon energy into DC electrical energy and for radiating and/or receiving electromagnetic waves.

BACKGROUND

Light or solar energy harvesting is needed for autonomous wireless transceivers which are compact in size, have a low cost, are light weight, and may be mobile. Moreover, portable, wearable, or other wireless devices may have non-linear shapes and may be flexible. Antennas other than wires are generally manufactured on a rigid or flexible printed circuit board or material, using a metalized surface or metalized strip lines.

The antenna is a distinct electronic element which has to interface to the RF front-end circuits. Some wireless systems use smart antenna technology, such as MIMO (multiple-input multiple-output), where antenna diversity is achieved by using two or more antennas for higher spectral efficiency and link reliability, which adds to the cost and size. Software-defined-radios (SDR) and ultra-wideband (UWB) transceivers use a wide frequency bandwidth requiring large bandwidth antennas. Other transceivers combine multiple standards into one device, e.g., GPS at 1.5 GHz, GSM at 900 MHz and 1.8 GHz, UMTS at 2100 MHz, and LTE in the 2600 MHz band in Europe. Antenna arrays also use multiple antenna elements for the purpose of achieving higher antenna gain and directivity. Antenna arrays are commonly used in space and terrestrial communications.

Nowadays, the antenna and packaging of the wireless system have become the bottleneck of the system by increasing to one-third of the cost of the wireless module, far surpassing the cost of the electronic integrated circuits. Energy efficient designs are needed to minimize the d.c. (DC) power consumption by integrating all electronic devices together and minimizing the number of elements, leading to smart system integration, such as system-in-package, system-on-chip, system-on-package, and lab-on-a-chip.

Nowadays, antenna elements are either bought as a separate device or are part of a circuit board where they interface with other electronic devices, or within the casing of enclosed electronic devices. The dual functionality of a photovoltaic cell for absorbing light energy and radiating and/or receiving electromagnetic waves has been initially investigated for satellite and terrestrial communication applications. Unfortunately, prior art photovoltaic cell, or "solar antenna", and radio-frequency antennas solutions presented do not offer the flexibility and the compactness required for low-power transceiver systems, such as for autonomous wireless sensor networks, which is a drawback.

In addition, these prior art photovoltaic cell and radio-frequency antennas are not easily integrated with other electronic devices and are thus bulky.

Research experiments have been conducted by M. Tanaka, Y. Suzuki, K. Araki, and R. Suzuki for combining a photovoltaic cell and a radio-frequency antenna into a single device and have been published in "Microstrip antenna with solar cells for microsatellites", *Electronic Letters*, vol. 31, no. 1, pp. 5-6, Jan. 5, 1995. Unfortunately, the prior art photovoltaic cell and radio-frequency antennas disclosed are primarily aimed at satellite and terrestrial applications which are restricted to narrowband frequency operation which is a drawback.

Common patch antenna elements have been disclosed by Bendel et al. in U.S. Pat. No. 6,395,971. These elements interface to other electronic devices, such as an RF transceiver via a shielded cable, one example of such embodiment has been disclosed by Kiefer in U.S. Pat. No. 6,590,150. Unfortunately, in such embodiment, power losses are added to the transmitting or received signals, which decreases the energy efficiency of the wireless system which is also a drawback.

Previously published materials have shown many drawbacks that render them cumbersome for compact autonomous wireless smart integrated systems.

Moreover and in the case where the antenna is a patch antenna, an RF ground plane is required. The RF ground plane is located on an insulating material substrate, below the photovoltaic cell and radio-frequency antenna. A patch antenna may not be used for ultra-wideband (>20% or >500 MHz) frequency bandwidths. As the front contacts of the photovoltaic cell are located on its top surface for providing an electrical potential, a top to down interconnection to a substrate is required.

There is a need for an assembly that will overcome at least one of the above-identified drawbacks.

Features of the invention will be apparent from review of the disclosure, drawings, and description of the invention below.

BRIEF SUMMARY

In accordance with an embodiment there is provided an integrated photovoltaic cell and radio-frequency (RF) antenna assembly, the assembly comprising a photovoltaic cell and at least two horizontal portions of conductive material, each of the at least two horizontal portions of conductive material being secured under the photovoltaic cell, wherein two of the at least two horizontal portions are used for providing an electrical potential difference and the RF antenna is provided using the photovoltaic cell and at least one of the at least two horizontal portions of conductive material.

In accordance with an embodiment, the photovoltaic cell is fabricated using a material selected from a group consisting of semiconductor materials, thin film materials, inorganic materials, nano materials, organic materials and dye-sensitized materials.

In yet another embodiment, the photovoltaic cell comprises a top layer, a transparent conductive film layer secured under the top layer, a first electrode layer secured under at least one part of the transparent conductive film layer, a second electrode layer secured under the first electrode layer and a first horizontal portion of conductive material of the at least two horizontal portions of conductive material is secured under the transparent conductive film layer and a second horizontal portion of conductive material of the at least two horizontal portions of conductive material is secured under the second electrode layer of the photovoltaic cell.

In yet another embodiment of the integrated photovoltaic cell and RF antenna assembly, the first electrode layer comprises a p-layer <p>, the second electrode layer comprises a n-layer <n>, an intrinsic <i> material layer is secured under the p-layer <p>, and the n-layer <n> is secured under the intrinsic <i> material layer.

In yet another embodiment of the integrated photovoltaic cell and RF antenna assembly, the first electrode layer comprises a n-layer <n>, the second electrode layer comprises a p-layer <p>, an intrinsic <i> material layer is secured under the n-layer <n>, and the p-layer <p> is secured under the intrinsic <i> material layer.

In yet another embodiment of the integrated photovoltaic cell and RF antenna assembly, the first horizontal portion of conductive material and the second horizontal portion of conductive material are one of a liquid and a microfluid.

In yet another embodiment of the integrated photovoltaic cell and RF antenna assembly, the first horizontal portion of conductive material and the second horizontal portion of conductive material comprise a transparent conductive film layer.

In yet another embodiment of the integrated photovoltaic cell and RF antenna assembly, a low-pass filter is operatively connected to the two of the at least two horizontal portions for RF decoupling the two of the at least two horizontal portions.

In yet another embodiment, the photovoltaic cell comprises a slot and one of a microstripline and a stripline is located between the at least two horizontal portions of conductive material and the photovoltaic cell.

In yet another embodiment of the integrated photovoltaic cell and RF antenna assembly, extra conductive material is operatively connected to a selected horizontal portion of conductive material of the at least two horizontal portions of conductive material.

In yet another embodiment of the integrated photovoltaic cell and RF antenna assembly, the extra conductive material is placed adjacent to the selected horizontal portion of conductive material of the at least two horizontal portions of conductive material.

In yet another embodiment of the integrated photovoltaic cell and RF antenna assembly, the extra conductive material is placed partly underneath the selected horizontal portion of conductive material of the at least two horizontal portions of conductive material.

In yet another embodiment of the integrated photovoltaic cell and RF antenna assembly, the integrated photovoltaic cell and RF antenna assembly comprises a plurality of photovoltaic cells.

In yet another embodiment, the integrated photovoltaic cell and RF antenna assembly has a three-dimensional (3D) shape.

In yet another embodiment of the integrated photovoltaic cell and RF antenna assembly, the three-dimensional (3D) shape is taking advantage of a moving light energy position.

In yet another embodiment of the integrated photovoltaic cell and RF antenna assembly, at least one of the photovoltaic cell and said RF antenna is stretchable.

In yet another embodiment of the integrated photovoltaic cell and RF antenna assembly, at least one of the photovoltaic cell and the RF antenna is flexible.

In yet another embodiment an integrated photovoltaic cell and RF antenna assembly comprising a plurality of integrated photovoltaic cell and RF antenna assemblies is provided.

In yet another embodiment, an integrated photovoltaic cell and aperture-coupled patch antenna is disclosed, the integrated photovoltaic cell and aperture-coupled patch antenna comprising an integrated photovoltaic cell and RF antenna assembly, a slotted photovoltaic cell RF ground plane; the slotted photovoltaic cell RF ground plane and the integrated photovoltaic cell and RF antenna assembly is separated by one of an insulating material and air.

In yet another embodiment, the integrated photovoltaic cell and RF antenna assembly further comprises a reflector located under the integrated photovoltaic cell and RF antenna assembly.

In yet another embodiment, an integrated photovoltaic cell and monopole antenna is disclosed, the integrated photovoltaic cell and monopole antenna comprises an integrated photovoltaic cell and RF antenna assembly; a photovoltaic cell RF ground plane having an opening; a post-like connection engaged in the opening of the photovoltaic cell RF ground plane and operatively connected to the integrated photovoltaic cell and RF antenna assembly, the post-like connection being used for providing at least one of RF excitation and reception.

In yet another embodiment of the integrated photovoltaic cell and RF antenna assembly, the RF antenna is RF differentially driven.

In yet another embodiment, a planar monopole integrated photovoltaic cell and RF antenna assembly is disclosed, the planar monopole integrated photovoltaic cell and RF antenna assembly comprises a supporting non-conductive material; an integrated photovoltaic cell and RF antenna assembly placed on the supporting non-conductive material; a conducting line for providing an RF signal excitation or reception to the integrated photovoltaic cell and RF antenna assembly; wherein photovoltaic cell and RF antenna grounds are separated from the conducting line by a determined spacing.

In yet another embodiment of the planar monopole integrated photovoltaic cell and RF antenna assembly, one of a coplanar waveguide (CPW) and a grounded coplanar waveguide feed is used.

In yet another embodiment of the planar monopole integrated photovoltaic cell and RF antenna assembly, the conducting line comprises a microstrip line feed located on one of a same plane as the integrated photovoltaic cell and RF antenna assembly and a partly conductive backside of the supporting non-conductive material.

In yet another embodiment of the integrated photovoltaic cell and RF antenna assembly, a slotted dipole antenna is provided.

In yet another embodiment, an inverted F antenna (IFA) is provided, the inverted F antenna comprises an integrated photovoltaic cell and RF antenna assembly, the RF antenna is RF excited at one point and an RF ground is connected at another point.

In yet another embodiment, a planar inverted F antenna (PIFA) is provided, the planar inverted F antenna comprising an integrated photovoltaic cell and RF antenna assembly and the RF antenna is RF excited at one point and an RF ground connects at another point.

In yet another embodiment of the integrated photovoltaic cell and RF antenna assembly, the integrated photovoltaic cell and RF antenna assembly has one of a single polarization and multiple polarizations.

In yet another embodiment of the integrated photovoltaic cell and RF antenna assembly, the photovoltaic cell and RF antenna assembly has a single polarization selected from a group consisting of a horizontal polarization and a vertical polarization.

In yet another embodiment of the integrated photovoltaic cell and RF antenna assembly, the integrated photovoltaic cell and RF antenna assembly comprises an energy storage device for storing energy.

In yet another embodiment of the integrated photovoltaic cell and RF antenna assembly, the energy storage device is interfaced to an electronic device.

In yet another embodiment of the integrated photovoltaic cell and RF antenna assembly, the energy storage device is further used as an RF reflector.

In yet another embodiment of the integrated photovoltaic cell and RF antenna assembly, the integrated photovoltaic cell and RF antenna assembly is embedded in one of microelectromechanical systems (MEMS) and nanoelectromechanical systems (NEMS).

In yet another embodiment of the integrated photovoltaic cell and RF antenna assembly, the integrated photovoltaic cell and RF antenna assembly further comprises a thermal power generator for providing energy.

In yet another embodiment of the integrated photovoltaic cell and RF antenna assembly, the photovoltaic cell and RF antenna assembly is integrated to at least one electronic device.

In yet another embodiment of the integrated photovoltaic cell and RF antenna assembly, the photovoltaic cell and RF antenna assembly is woven within a textile material to form an integrated photovoltaic cell and RF antenna assembly in the textile material.

In yet another embodiment of the integrated photovoltaic cell and RF antenna assembly, the photovoltaic cell and RF antenna assembly is made as a "peel and stick" device.

The integrated photovoltaic cell and RF antenna assembly constitutes an antenna or part of an antenna for the purpose of radiating and receiving radio-frequency energy and is also used for transferring DC energy to an electronic device or several electronic devices.

In one embodiment, the integrated photovoltaic cell and RF antenna assembly may be used for autonomous or semi-autonomous wireless transceivers which are compact in size. The integrated photovoltaic cell and RF antenna assembly may be easily integrated or embedded within a material, which may be flexible and/or stretchable.

Multiple integrated photovoltaic cell and RF antenna assemblies may be used for dipole-like antennas as well as broadband frequency operation, which can be easily integrated to other electronic devices. Wideband frequency operations may also be possible by changing the shape of at least one of the photovoltaic cell and at least one of the at least two horizontal portions of conductive materials used for transferring the DC energy.

It will be appreciated that flexible photovoltaic cells may be used for flexible antennas which are conformable to any object or body shape and any material.

Thin film photovoltaic cells are compatible with other thin film technologies by adding extra fabrication processing steps, thus enabling a highly integrated wireless module.

It will be appreciated that at least one of the embodiments disclosed may be of great interest when considering environmental/economic factors; in particular, for applications using solar or light energy harvesting, such as but not limited to ubiquitous networks, wireless sensor networks (WSN), radio-frequency identification (RFID), wireless flexible displays or large-area electronics, wireless e-paper, portable or wearable wireless devices, and wireless location tracking.

An advantage is that one of the integrated photovoltaic cell and RF antenna assemblies disclosed may be easily integrated with other electronic devices, such as an RF transceiver and/or power management devices and with any material.

Another advantage is that one of the integrated photovoltaic cell and RF antenna assemblies disclosed may enable a cost reduction by integrating at least one photovoltaic cell with RF antenna capabilities into a single element instead of having two discrete elements.

A further advantage of one of the integrated photovoltaic cell and RF antenna assemblies disclosed is that it enables a reduction of the number of elements used in a system.

Another advantage of one of the integrated photovoltaic cell and RF antenna assemblies disclosed is that it may be flexible, conformable to any object or body shape and placed over any material, constituting smart materials, such as smart textile.

A further advantage of one of the integrated photovoltaic cell and RF antenna assemblies disclosed is that its thickness may be very small, in the nanometer or the micrometer range in one embodiment.

Another advantage of one of the integrated photovoltaic cell and RF antenna assemblies disclosed is that it may provide a lightweight system.

A further advantage of one of the integrated photovoltaic cell and RF antenna assemblies disclosed is that it may be used for a fixed, mobile, portable, or wearable system.

A further advantage of one of the integrated photovoltaic cell and RF antenna assemblies disclosed is that it may enable a maximization of solar or light radiation absorption with three-dimensional, rotating photovoltaic cell element, and/or foldable configurations.

Another advantage of one of the integrated photovoltaic cell and RF antenna assemblies is that it may provide a direct integration of RF differentially-excited integrated photovoltaic cell and RF antenna assemblies, such as dipoles or loops, with an electronic RF transceiver device.

A further advantage of one of the integrated photovoltaic cell and RF antenna assemblies disclosed is that it may enable a direct integration with other thin film technologies, such as thin film transistors used for display, digital, analog/RF circuits, thin film batteries, or a direct integration of organic and/or nanoscale electronic technologies, leading to a low cost mass production roll-to-roll or reel-to-reel (R2R) manufacturing.

BRIEF DESCRIPTION OF THE DRAWINGS

In order that the invention may be readily understood, embodiments of the invention are illustrated by way of examples in the accompanying drawings.

FIGS. 8A-E show various configurations of stacked or multiple PV cells used for the antenna.

Further details of the invention and its advantages will be apparent from the detailed description included below.

DETAILED DESCRIPTION

In the following description of the embodiments, references to the accompanying drawings are by way of illustration of an example by which the invention may be practiced. It will be understood that other embodiments may be made without departing from the scope of the invention disclosed.

Figure 1:
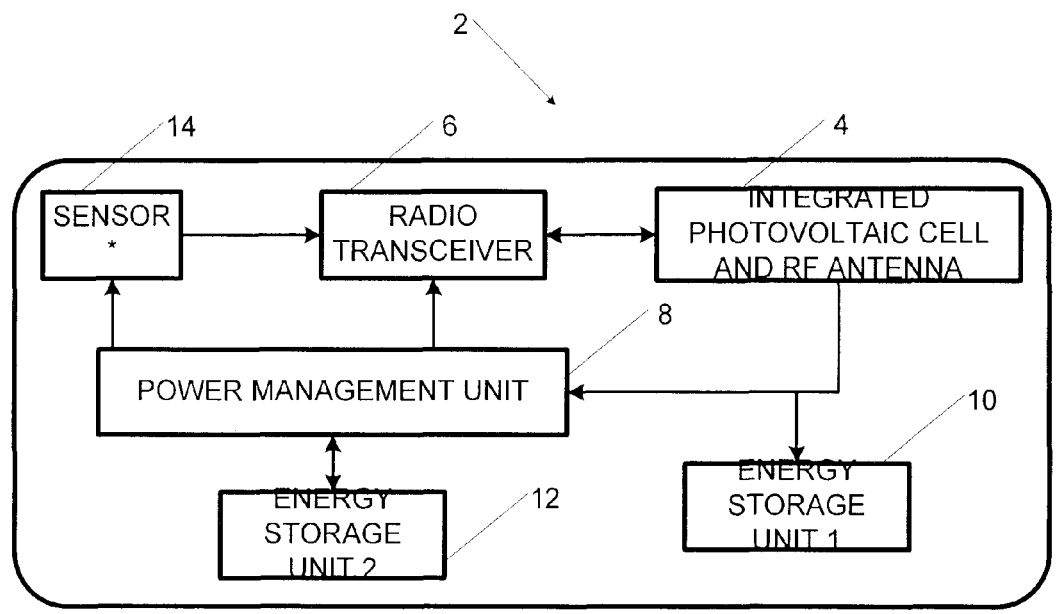
FIG. 1 is a block diagram which shows an embodiment of a light energy harvesting wireless autonomous transceiver system comprising an embodiment of the integrated photovoltaic cell and RF antenna assembly.

A wireless autonomous transceiver 2 using light or solar energy harvesting is shown in FIG. 1. The wireless autonomous transceiver 2 comprises an integrated photovoltaic cell and radio-frequency (RF) antenna assembly 4, a radio transceiver 6, a power management unit 8, a first optional energy storage 10, a second optional energy storage 12 and an optional sensor 14.

The integrated photovoltaic cell and RF antenna assembly 4 acts as an RF antenna and as a DC energy generator and interfaces with the radio transceiver 6, the power management unit 8, and optionally the energy storage unit 10 or several energy storage units 10, 12. In the case of wireless sensor network (WSN) applications, the sensor 14 may be provided.

It will be appreciated that the integrated photovoltaic cell and RF antenna assembly 4 may be a photovoltaic panel or module instead of a single photovoltaic cell.

It will be appreciated that the integrated photovoltaic cell and RF antenna assembly 4, the radio transceiver 6, the power management unit 8, the first optional energy storage 10, the second optional energy storage 12 and the optional sensor 14 may be integrated with or within materials which can be flexible and stretchable in nature, such as those used for printed electronics (polymer, plastic, organic or inorganic materials), textile, biocomposite or bio-compatible materials, thin glass layer, thin semiconductor layer, paper, nanoparticles, or nanotubes.

The skilled addressee will appreciate that by integrating the various components of the wireless autonomous transceiver 2 together, it is possible to minimize the number of components and therefore provide a more compact wireless device which is of great advantage. Moreover, by minimizing the interconnections required from one device to another and thus, the losses and signal coupling effects, especially at radio-frequencies, it is possible to enhance the efficiency of the wireless autonomous transceiver 2 which is also of great advantage.

It will be appreciated that such systems may be applied to small-scale as well as large-scale or large-area electronics. In particular, the integrated photovoltaic cell and RF antenna assembly 4 disclosed herein, also referred to as solar antenna or "solant", may be used for analog, digital, pulse, or soliton wave radiation or reception.

By integrating the integrated photovoltaic cell and RF antenna assembly 4 with other electronic devices within the same material or substrate, a system-in-package (SiP) may be obtained. Moreover, by further integrating the integrated photovoltaic cell and RF antenna assembly 4 with other electronic components or circuits, such as using thin-film technologies, an equivalent system-on-chip (SoC) or system-on-package (SoP) may be achieved.

As known by the skilled addressee a photovoltaic, or solar, cell converts the energy of light or photon, or sunlight, directly into electricity due to its structure. The photovoltaic cell may be fabricated using a semiconductor material, such as silicon (Si) or gallium arsenide (GaAs), nano-materials, such as carbon nanotubes, or printed electronics. In the case where the semiconductor material is silicon, a pn junction is manufactured, where a direct current (DC) current is generated. Common types of photovoltaic cells include, but are not limited to single-junction GaAs; multi-junction cells; crystalline silicon, either single crystal, multicrystalline, or thick film; thin film material technologies, such as CdTe, amorphous Si, multicrystalline junction, nano- micro- or poly-Si; dye-sensitized materials; organic and inorganic materials. Since these photovoltaic cells are very thin, in the order of a few nanometers or micrometers, some technologies may be provided for obtaining flexible photovoltaic cells, as described for instance in *Flexible Solar Cells*, by M. Pagliaro, G. Palmisano, and R. Ciriminna, Wiley-VCH Verlag Gmbh, 2008.

Figure 2:
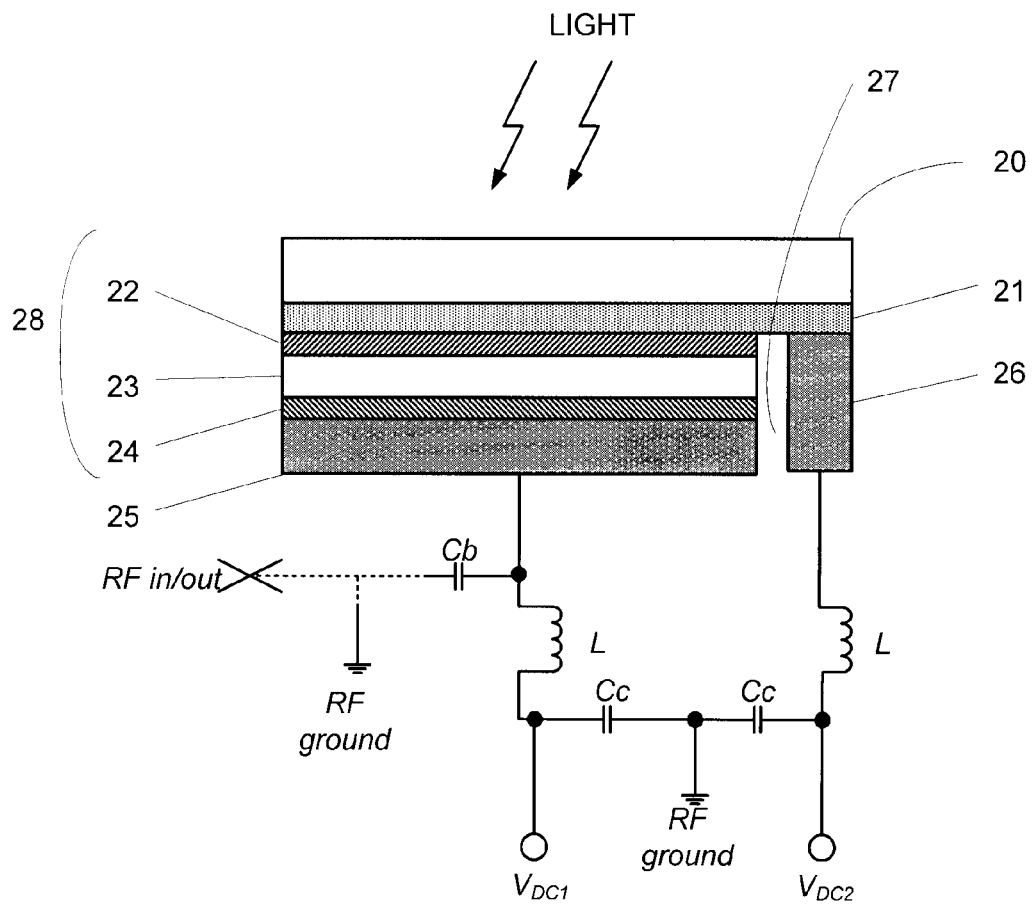
FIG. 2 is a schematic which shows a cross-section of a thin-film integrated photovoltaic cell and RF antenna assembly comprising two horizontal portions of conductive materials secured under a photovoltaic cell.

Referring to FIG. 2, there is shown an embodiment of a silicon thin film integrated photovoltaic cell and RF antenna assembly wherein the photovoltaic cell comprises a top layer 20, a transparent conductive film (TCF) layer 21, a p-layer <p> 22, an intrinsic <i> 23 material and a n-layer <n> 24.

More precisely, the top layer 20 is used as a protective encapsulant for the photovoltaic cell. The transparent conductive film (TCF) layer 21 is used as an electrical conductor on the topside, which matches the refractive indices between p-type silicon, metal contact, and encapsulant layers to improve the efficiency of the photovoltaic cell. The p-layer <p> 22 (a first embodiment of a first electrode layer secured under the transparent conductive film) forms the positive DC contact (DC+) on the topside TCF layer, whereas the n-layer <n> 24 (a first embodiment of a second electrode layer)

provides the negative DC contact (DC−). In this embodiment, an intrinsic <i> 23 material is sandwiched between the p-layer <p> 22 and the n-layer <n> 24 to form a p-i-n junction. It will be appreciated that while a p-i-n junction has been disclosed, a n-i-p junction may be alternatively provided. In such embodiment, the first electrode layer comprises an n-layer <n> and the second electrode layer comprises a p-layer <p>. Moreover, it should be understood that multiple stacked p-i-n or n-i-p layers may also be feasible. Although only a thin film technology is shown, multiple stacked PV technologies may be feasible, such as amorphous and crystalline silicon.

The integrated photovoltaic cell and RF antenna assembly further comprises a first horizontal portion of conductive material 25 and a second horizontal portion of conductive material 26. It will be appreciated that the first horizontal portion of conductive material 25 and the second horizontal portion of conductive material 26 are used as contact electrodes of the photovoltaic cell and thus provide for an electrical potential difference and are an embodiment of at least two horizontal portions of conductive material. Such conductive material may not be a metal or carbon and be considered as a poor conductor. In one embodiment, the conductive material may be in the form of one of a liquid or microfluid.

In one embodiment, the first horizontal portion of conductive material 25 and the second horizontal portion of conductive material 26 comprise a layer of transparent conductive film.

It will be appreciated that in the embodiment disclosed in FIG. 2, both the first horizontal portion of conductive material 25 and the second horizontal portion of conductive material 26 are located under the photovoltaic cell which facilitate the connectivity to other elements. This therefore advantageously enables the providing of the integrated photovoltaic cell and RF antenna assembly.

In order to fabricate the second horizontal portion of conductive material 26 in the same horizontal plane than the first horizontal portion of conductive material 25, some photovoltaic cell material may be etched away in one embodiment or a specific contact electrode surface area is allocated in the photovoltaic fabrication processing step. Such technology may include back contact photovoltaic cells which may be embodied using techniques such as metallization wrap-trough (MWT), emitter wrap-through (EWT), and back-junction cells or buried contacts.

The skilled addressee will appreciate that this is of great advantage of prior art photovoltaic cell designs which allowed only a top contact to be located on the topside of the photovoltaic cell. Prior art photovoltaic cell designs thus greatly suffered from requiring a ribbon bond or other interconnect element in order to bring the connection to a substrate. In fact, such prior art configuration may not be suitable for high frequency antenna designs, especially for microwave (in the range of 3-30 GHz) or millimeter-wave designs (in the range of 30-300 GHz).

Still referring to FIG. 2, it will be appreciated that the first horizontal portion of conductive material 25 is used directly for both RF and DC− connectivity, whereas the second horizontal portion of conductive material 26 is only used for the DC+ connectivity.

It should be understood that alternative embodiments may be provided wherein the first horizontal portion of conductive material 25 and the second horizontal portion of conductive material 26 are used as RF contacts or wherein the second horizontal portion of conductive material 26 is used only as RF contact. It will be appreciated that the RF contact sizes will depend on both the desired DC current generation and the performance characteristics of the antenna.

It will be further appreciated that when designing an integrated photovoltaic cell and RF antenna assembly, the spacing 27 between the first horizontal portion of conductive material 25 and the second horizontal portion of conductive material 26 may be taken into consideration especially when higher frequencies are used, achieved with the help of an electromagnetic field solver or simulator.

It will be appreciated that the integrated photovoltaic cell and RF antenna assembly disclosed herein is not limited to a given number of contacts. Hence, as shown in FIG. 2, the first horizontal portion of conductive material 25 provides the basis of an electromagnetic/RF wave radiator or absorber, which would also excite the other conductive elements present around the first horizontal portion of conductive material 25, such as the transparent conductive film (TCF) layer 21 and the second horizontal portion of conductive material 26.

It will be also appreciated that in the embodiment disclosed the transparent conductive film (TCF) layer 21 is conductive, which also contributes to the RF radiation. In the case where the second horizontal portion of conductive material 26 is also located close to another contact, coupling RF fields are generated and also contribute to the RF radiation. Inversely, the integrated photovoltaic cell and RF antenna assembly may also receive or absorb such RF radiations. Thus, both the first horizontal portion of conductive material 25 and the second horizontal portion of conductive material 26 must be RF-decoupled in order to filter the RF signals on the DC connections. This may be performed using a low-pass filter topology with an RF inductor choke (L) and a shunt capacitor (Cc). Multiple LCc sections may be used in order to suppress the unwanted RF signals which may have broadband frequency characteristics. Hence, the photovoltaic cell in conjunction with the first horizontal portion of conductive material 25 and the second horizontal portion of conductive material 26, constitutes the integrated photovoltaic cell and RF antenna assembly 28 element.

It will be appreciated by the skilled addressee that the RF inductor choke (L) and the shunt capacitor (Cc) may be of the form of lumped elements or discrete components. Common inductive lumped elements consist of high impedance lines which may be tuned to the frequency to be shorted with a quarter-wavelength transmission line, namely at the frequency of operation of the antenna. In fact, this technique is suitable for narrowband frequency of operation. The lumped elements may be embedded within the process, using other material secured under the photovoltaic cell or located adjacent to the photovoltaic cell.

As shown in FIG. 2, if an RF connection is required at one or more contacts, an at least DC blocking capacitor (Cb) may be needed, as part of a high-pass filter. The first horizontal portion of conductive material 25 and the second horizontal portion of conductive material 26 may also be used as RF grounds. In this embodiment, a capacitor is needed in order to decouple the RF ground from the DC electrical potentials, as the DC blocking capacitor (Cb) will act as high-pass filter. Such configuration may be used for slot antennas where the RF fields are radiated through a slot in a ground plane or as a common RF ground plane for another antenna element.

In the case where both DC and RF grounds must be connected at the same point, the negative DC potential of the photovoltaic cell is decoupled as stated above and an added RF choke (inductor element) is added to directly connect to the grounds in order to add further RF decoupling on the DC line.

In the case of an aperture-coupled integrated photovoltaic cell and RF antenna assembly, such as for an aperture-coupled or a coupled patch antenna, the contacts of the at least top integrated photovoltaic cell and RF antenna assembly will only have the direct DC connectivity. The RF waves are excited by means of another antenna element, such as a slotted ground plane in the case of an aperture-coupled antenna configuration or a strip line under the patch antenna element which couples directly to the patch. Another alternative is to have a direct coupled RF signal output/input of a transceiver circuit element located under the patch antenna. If an RF differentially excited antenna is designed, an RF ground may not be needed.

Since the integrated photovoltaic cell and RF antenna assembly serves two purposes i.e. for providing DC power and for providing an RF antenna for RF signal radiation or reception, the overall size and shape of the integrated photovoltaic cell and RF antenna assembly will depend on these two requirements. The surface-area size of the conductive photovoltaic cell contact materials will determine the available DC power, as illustrated in FIG. 2 for the back contact 25. The size and shape of the conductive materials will determine the antenna RF characteristics. Hence, by choosing a specific shape for the at least two horizontal portions and/or the photovoltaic cell which comprises a TCF layer, the antenna can be designed according to the desired frequency of operation, frequency bandwidth, input impedance, antenna gain, etc. For antenna design purposes, the conductive material may be extended beyond the at least two horizontal portions.

Figure 3:
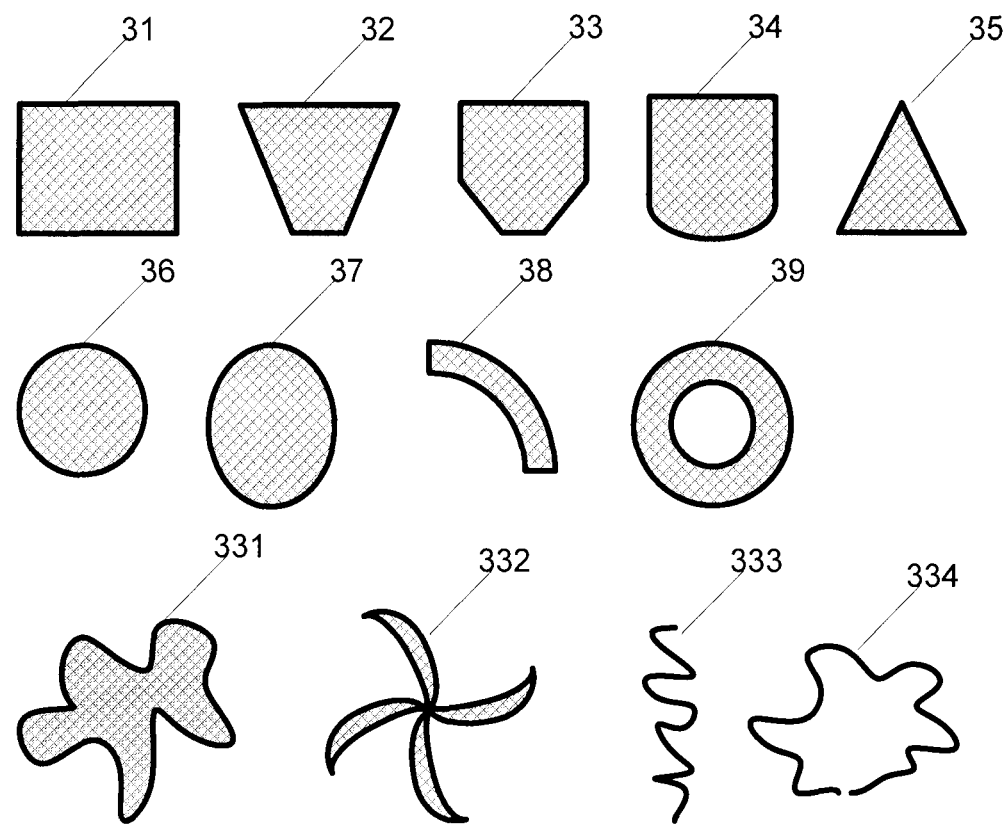
FIG. 3 shows a top plan view of several embodiments of an integrated photovoltaic cell and RF antenna assembly.

Referring to FIG. 3, there are shown various planar shapes for the integrated photovoltaic cell and RF antenna assembly which could be useful for antenna designs. These shapes may be made arbitrary. For instance, shape 31 is a linear and rectangular shape which may be useful for patch or fat monopole-like antennas. Shape 32 has a trapezoidal shape which may be used for patch, fat monopole-like, or if two similar shapes are driven differentially a bowtie antenna is obtained. Shape 33 is similar to shape 32, but may have a more wideband frequency characteristics, as well as shape 34. Shape 35 is a triangular shape, similar to shape 32, and if two similar shapes are driven differentially a bowtie antenna is obtained. Shape 36 is circular whereas shape 37 is an ellipse which may be used primarily for wideband or ultra-wideband frequency responses. Shape 38 is an arc with a certain line width. Shape 39 is a ring with a certain line width, made to resonate at a specific frequency or depending on its RF excitation, may have multiple resonances useful for multiple frequency antenna characteristics. Shape 331 has an arbitrary form, which includes space-filling curves or fractal shapes. Shape 332 may be a spiral antenna with one common RF excitation or multiple RF excitations, useful for broadband frequency characteristics. This example shows four sections which may be from four different photovoltaic cells.

The overall integrated photovoltaic cell and RF antenna assembly may consist of several integrated photovoltaic cell and RF antenna assemblies connected together in series and/or in parallel for its DC connections and used as an RF radiator or receiver or an RF ground. These integrated cell and RF antenna assemblies may be embedded within one encapsulant material 20.

Shape 333 resembles a wire-like antenna, such as a wire monopole, and if two wires are differentially driven, as a wire dipole. Shape 334 may be a wire-like loop antenna which is driven differentially. These wire-like antennas may be fabricated using a conductive contact from the integrated photovoltaic cell and RF antenna assembly. These may also be space-filling curves or fractal-like antennas, which may have wideband frequency characteristics. It is up to the antenna specifications and one that is skilled in the art to design the shape or shapes that would satisfy the antenna requirements as well as the total DC power.

For example, if a patch antenna must be designed to resonate at 4 GHz on a FR-4 1.5 mm substrate or insulating material, a shape similar to shape 31 may have a total dimension of 2 cm×2 cm.

Figure 4:
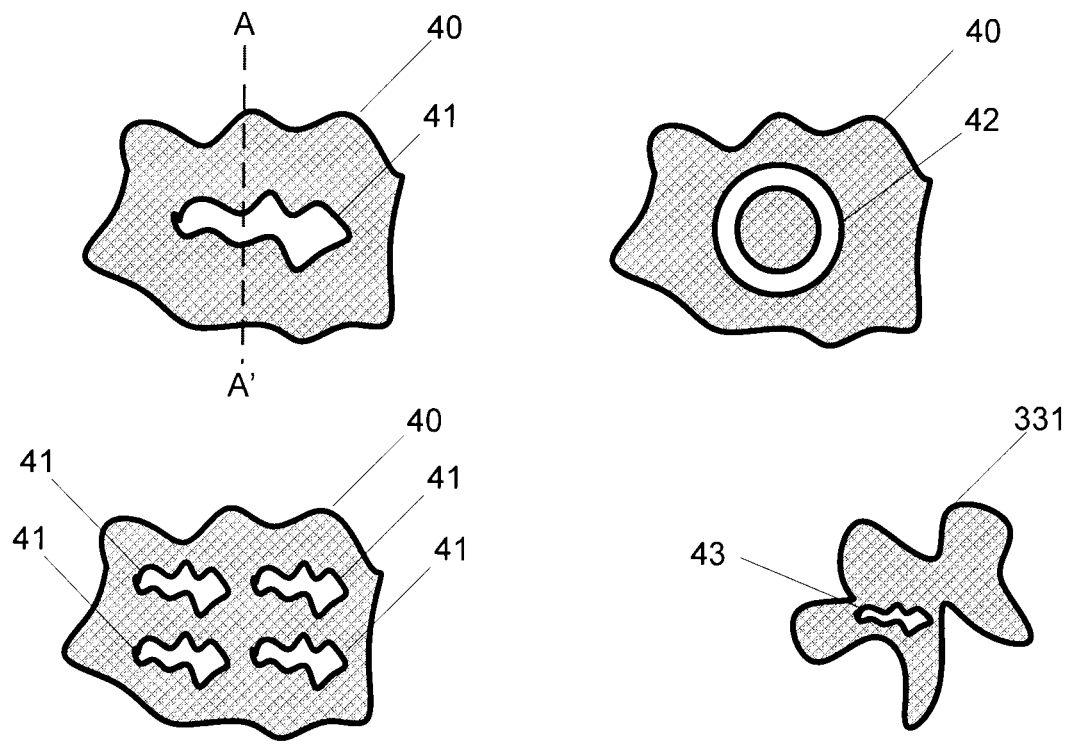
FIG. 4 shows various configurations of slotted integrated photovoltaic cell and RF antenna assemblies.

Referring to FIG. 4, there are shown alternative embodiments of integrated photovoltaic cell and RF antenna assembly configurations. Part of an arbitrary shape 40 may act as an RF ground plane. Arbitrary shape 41 is an opening in the integrated photovoltaic cell and RF antenna assembly and in the RF ground plane. It will be appreciated that multiple openings may also be made for various purposes, either in the RF ground plane or as part of an antenna element, such as slotted fractal patch antennas. The overall slot antenna element may be made of multiple integrated photovoltaic cell and RF antenna assemblies connected together in series and/or in parallel for its DC connections. Shape 42 shows a slot ring antenna.

Figure 5:
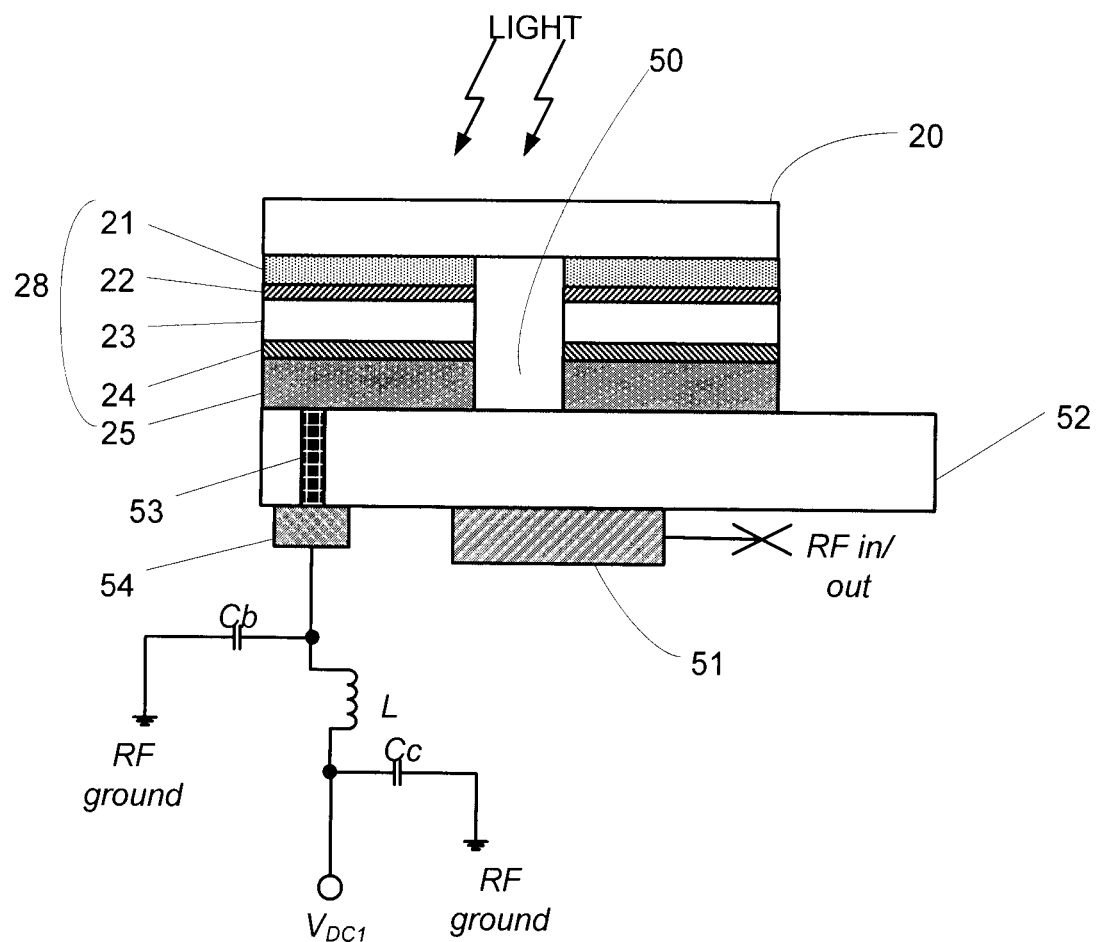
FIG. 5 is a cross-section view taken along line A-A' of a part of a thin-film integrated photovoltaic cell and RF antenna assembly which has a slot and which is shown in FIG. 4.

Referring to FIG. 5, there is shown a cross-section view taken along line A-A' of shape 40. In this case, only the encapsulant layer 20 is not removed. In this embodiment, only one, referred to by reference numeral 54, of the at least two horizontal portions of conductive material of the integrated photovoltaic cell and RF antenna assembly is shown. The slot 50 has a dimension corresponding to the antenna specifications, namely the frequency of resonance and the frequency bandwidth. It will be appreciated that the slot 50 must be RF excited by a microstripline or stripline 51 or other RF device, separated from the slotted ground plane by a certain height determined by the antenna design requirements. This separation from the slotted ground plane may be made either by an insulating material 52 which may be flexible or air.

The RF ground/DC line connection is made by a connecting contact 25 to some circuitry 54, with a via 53 or using other interconnect technology.

Now referring back to FIG. 4, the at least one integrated photovoltaic cell and RF antenna assembly ground plane 40 may be designed as a periodic structure, such as an electromagnetic bandgap (EBG), i.e. high impedance surface, a frequency selective surface (FSS) or a metamaterial (left-handed material), which use geometries and structures with multiple slots 41 in order to enhance the performance of the antenna.

Still referring to FIG. 4, an RF excited arbitrary shape 331 may also have a slot 43 or slots present in its photovoltaic cell. This slot 43 serves as a band-reject or band-pass frequency operation in the integrated photovoltaic cell and RF antenna assembly characteristics. This may be needed when a strong interferer at a particular frequency must be attenuated in order not to saturate the RF front-end circuit which operates over a wide frequency bandwidth.

Figure 6:
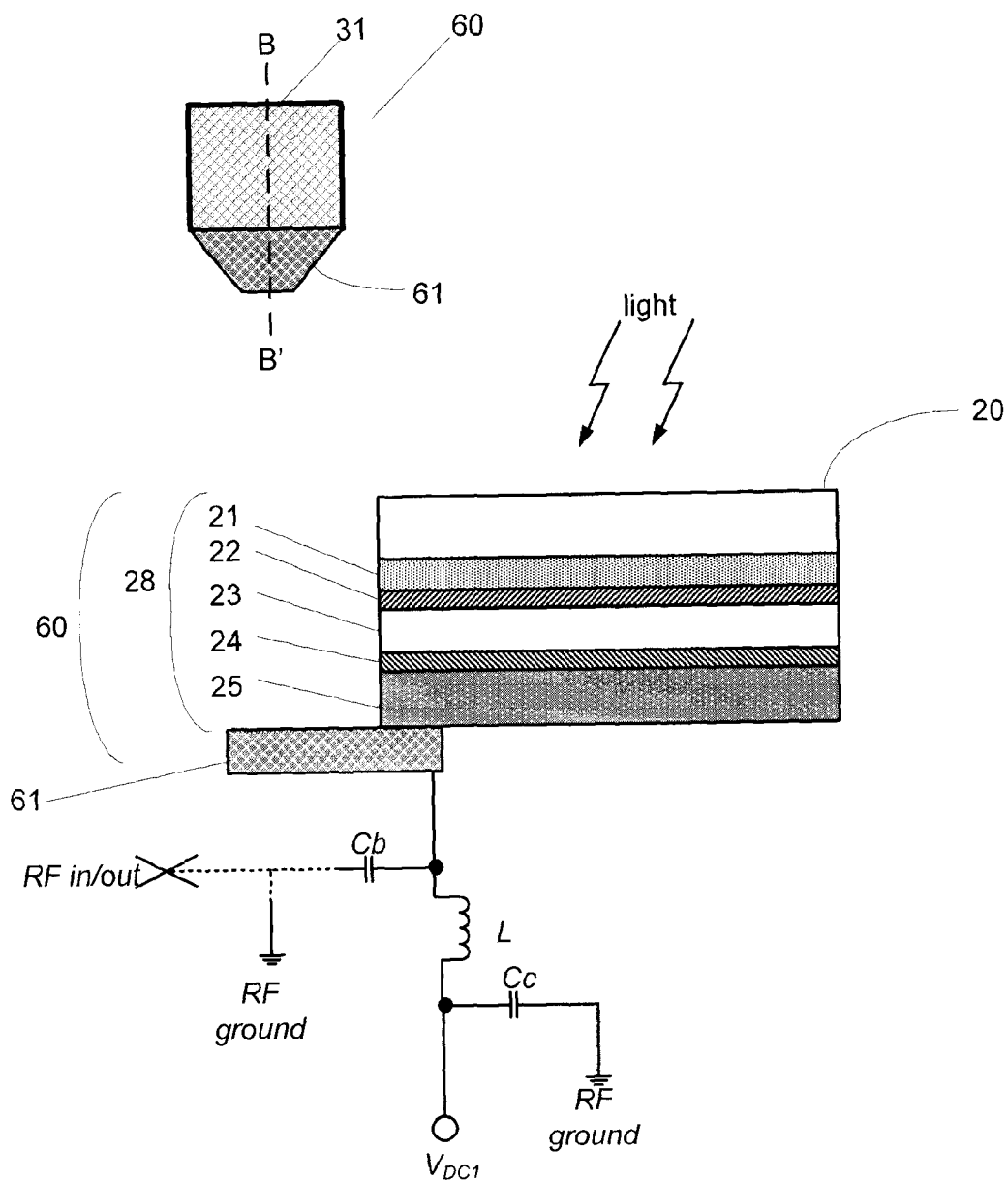
FIG. 6 shows an embodiment of an overall integrated photovoltaic cell and RF antenna assembly shape and a corresponding cross-section view taken along line B-B' of the integrated photovoltaic cell and RF antenna assembly resulting from an added conductive surface.

In some antenna designs, additional interconnects or overall antenna shape results from an integrated photovoltaic cell and RF antenna assembly element. Such an example is illustrated in FIG. 6, where the integrated photovoltaic cell and RF antenna assembly has a specific shape 31. Extra conductive material 61 is needed to not only interface with other circuitry, but also contribute to the antenna design layout 60. The extra conductive material 61 is operatively connected with the first horizontal portion of conductive material 25 and may be placed adjacent to the first horizontal portion of conductive material 25 or partly underneath the first horizontal portion of conductive material 25. This also applies to conductive material 26.

In FIG. 6, the extra conductive material 61 is placed partly under the first horizontal portion of conductive material 25 in order to make contact with first horizontal portion of conductive material 25. A conductive adhesive or thin conductive tape may be used. The extra conductive material 61 may also be placed on an insulating material 52, not shown.

It will be appreciated that the integrated photovoltaic cell and RF antenna assembly may also have an overall three-dimensional (3D) shape and may comprise a plurality of photovoltaic cells.

It will be appreciated that such configurations may be useful for maximizing an amount of light energy that can be absorbed with respect to the light source position. For example, as the earth rotates around the sun, the sun may light only a portion of the photovoltaic cell, as its position changes throughout the day. By providing multiple integrated photovoltaic cell and RF antenna assemblies, light is ensured to hit at least one photovoltaic cell surface. The integrated photovoltaic cell and RF antenna assembly must cover at least one of the surfaces of the 3D shape. Accordingly, the 3D shape may take advantage of a moving light energy position. Moreover, at least one of the photovoltaic cell and the RF antenna may be flexible and/or stretchable, these may conform to the surface of other objects.

Figure 7:
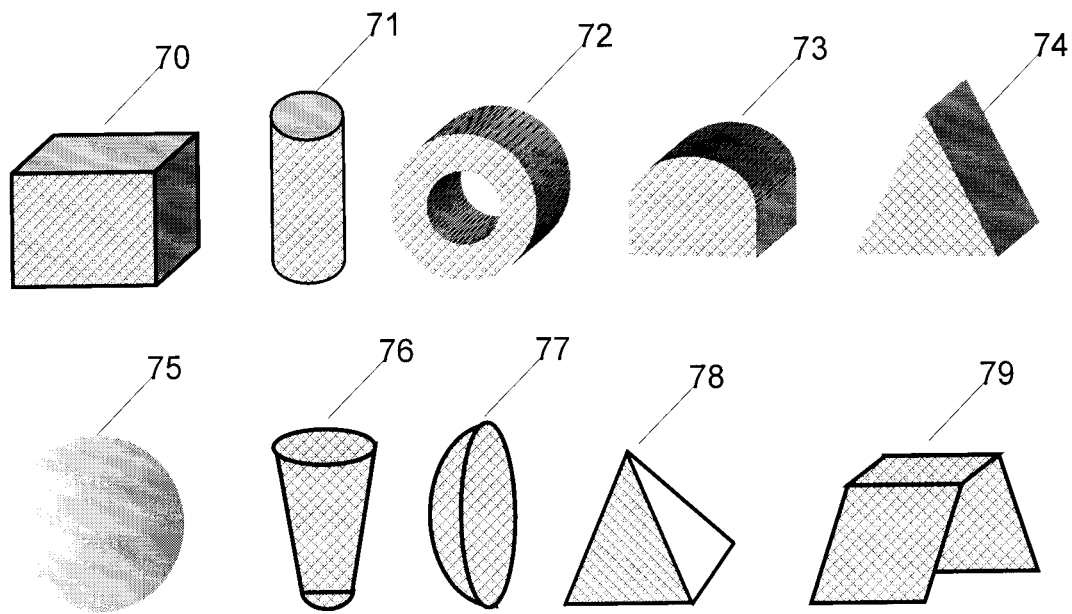
FIG. 7 shows various three-dimensional configurations of an integrated photovoltaic cell and RF antenna assembly.

Referring to FIG. 7, there are illustrated various 3D basic shapes of the integrated photovoltaic cell and RF antenna assembly. For instance, shape 70 is made as a box with six surfaces. Shape 71 is a cylinder and may be used as a rod. If the diameter of the cylinder is small enough such as to be considered as a wire-like antenna, it may be used as a wire monopole or dipole antenna. Shape 72 is a hollow rod, where the integrated photovoltaic cell and RF antenna assembly may be wound around the curved surface. Shape 73 is a rounded box which may be useful for wideband frequency antenna performances. Shape 74 shows a triangular configuration. Shape 75 is spherical while shape 76 is a cone. Shape 77 has a parabolic configuration. Shape 78 has a pyramidal configuration. The integrated photovoltaic cell and RF antenna assembly may also be foldable 79. As the integrated photovoltaic cell and RF antenna assembly may be flexible in nature, it can be made rollable.

Multiple integrated photovoltaic cell and RF antenna assemblies may be stacked or placed adjacent to each other in order to form a complete integrated photovoltaic cell and RF antenna assembly. Moreover, with multiple integrated photovoltaic cell and RF antenna assemblies, DC power may be added either by a series and/or a parallel connection.

Referring to FIG. 8A, an aperture-coupled patch antenna is formed by a top patch antenna element 80 which may also be an integrated photovoltaic cell and RF antenna assembly element, separated from a slotted photovoltaic cell RF ground plane 40 by an insulating material or air. The top patch antenna element 80 may also have a 3D shape, as disclosed in FIG. 7.

Moreover, placing a reflector, such as a ground plane or floating conductive material under the integrated photovoltaic cell and RF antenna assembly may also increase the electrical efficiency of the photovoltaic cell.

The conductive material used for the top patch element 80 may also be of a transparent conductive film (TCF) type. The photovoltaic cell ground plane 40 has larger dimensions than the top patch element 80, in order to maximize the light absorption for DC power conversion. The slot 41 is primarily located under the top patch antenna element 80. The RF ground plane 40 is separated by an insulating material 52, where the RF excitation 51 is located on its bottom side. With an aperture-coupled photovoltaic cell patch antenna structure, the top patch element 80 is RF excited through the slot 41 and thus, does not need any direct RF connection. Such structure may be useful when a large DC power is needed while the top patch antenna element may be small due to frequency scaling. This embodiment may also apply to antenna arrays.

Monopole integrated photovoltaic cell and RF antenna assemblies which use one or more integrated photovoltaic cell and RF antenna assemblies are illustrated in FIGS. 8B-D.

In FIG. 8B, an integrated photovoltaic cell and RF antenna assembly 80 is placed above a photovoltaic cell RF ground plane 40 with a certain height above the photovoltaic cell RF ground plane 40, determined by the antenna designer. The integrated photovoltaic cell and RF antenna assembly 80 must have an RF connection which may be provided by a post-like connection 81 or vertical interconnection. The photovoltaic cell RF ground plane 40 must then have an opening 82 for the connection. In one embodiment, the post-like connection 81 is engaged in the opening 82 of the photovoltaic cell RF ground plane 40 and is operatively connected to the integrated photovoltaic cell and RF antenna assembly and provides at least one of RF excitation and reception. Other interconnections are located on the backside of the photovoltaic cell RF ground plane 40. The integrated photovoltaic cell and RF antenna assembly 80 may have a 3D shape and may be made with integrated photovoltaic cell and RF antenna assemblies, in which case, the DC power lines must also be brought through the post-like connection 81. As the integrated photovoltaic cell and RF antenna assembly 80 lies above a surface, its post connection 81 may rotate, thus the integrated photovoltaic cell and RF antenna assembly 80 may be rotatable in such embodiment.

FIGS. 8C and 8D show planar monopole integrated photovoltaic cell and RF antenna assembly formed on a supporting non-conductive material 52 which may be flexible in nature. The integrated photovoltaic cell and RF antenna assembly 80 is RF connected through a coplanar-waveguide (CPW) feed and placed on the supporting non-conductive material 52. Elements 83 are the photovoltaic cell RF grounds which are separated from the conducting line 84 by a determined spacing 85. The CPW-feed RF impedance is designed such that it matches the impedance of the antenna for maximum power transfer to/from the antenna at the desired frequency or frequencies. The CPW-feed may also provide an easier integration with other electronic devices. The CPW-feed may also be placed on the backside of the insulating material 52, in which case the RF connection of the monopole integrated photovoltaic cell and RF antenna assembly 80 is provided by a radiated coupling strip element 84. Thus, the monopole integrated photovoltaic cell and RF antenna assembly 80 would only provide the DC power lines. The spacing between the top antenna conductive surface and the strip element 84 must be determined by the antenna designer. A gap 86 separates the ground plane from the monopole integrated photovoltaic cell and RF antenna assembly 80. A grounded CPW-feed may also be used, as another RF ground plane may be present on the backside of the insulating material 52.

In FIG. 8D, the planar monopole has a microstrip-feed type 87 which is either located on the same plane as the monopole integrated photovoltaic cell and RF antenna assembly 80 or on the backside of the supporting material 52. In this case, an RF transceiver which has an output or input impedance which matches that of the monopole integrated photovoltaic cell and RF antenna assembly 80 for maximum power transfer may also be located at the monopole antenna interface, hence, not requiring any microstrip line feed 87. The RF ground plane 83 may be of a uniform shape or as a periodic structure, separated from the monopole integrated photovoltaic cell and RF antenna assembly 80 by a certain gap 86. It will be appreciated that monopole or dipole integrated photovoltaic cell and RF antenna assemblies have the advantage of wideband or ultra-wideband frequency behavior, which is not achievable with a patch antenna.

Figure 8E:
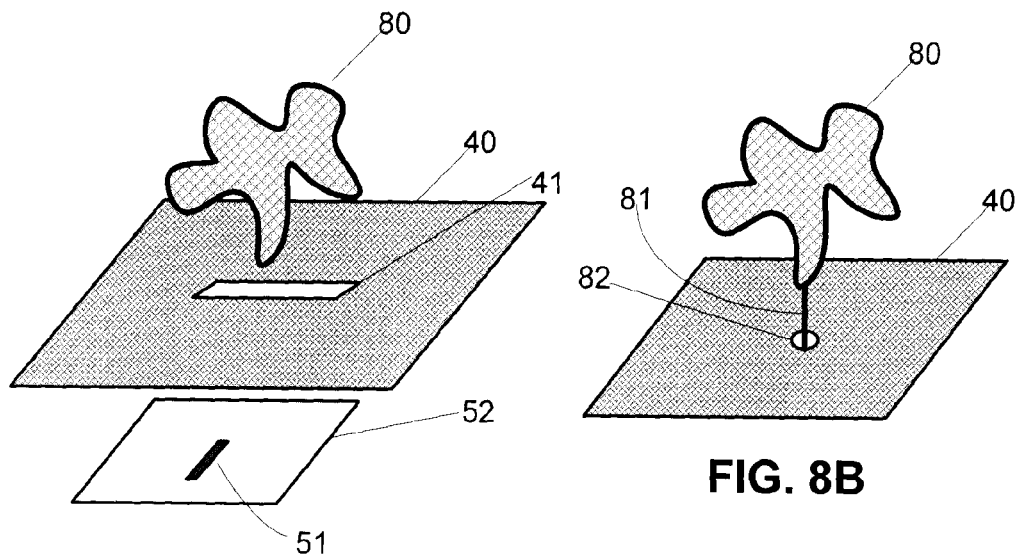
Figure 8E:
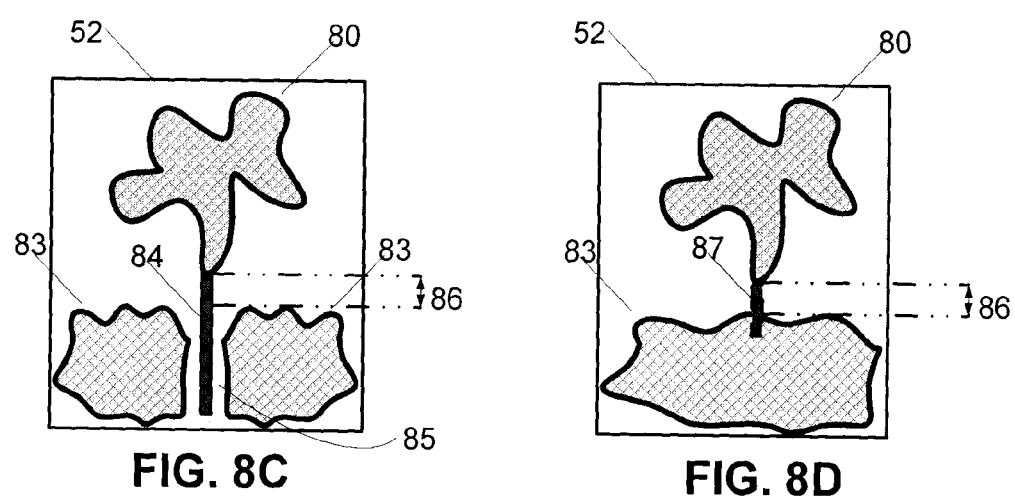
Figure 8E:
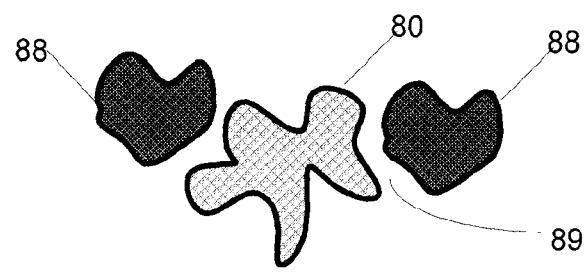

In FIG. 8E, multiple integrated photovoltaic cell and RF antenna assemblies 88 surround a main integrated photovoltaic cell and RF antenna assembly 80. This structure may be useful for increased DC power since all integrated photovoltaic cell and RF antenna assemblies DC powers may be added, and at the same time provide for a broader antenna frequency bandwidth via RF coupling between elements. A specific spacing 89 may be determined by the antenna designer.

Figure 9A:
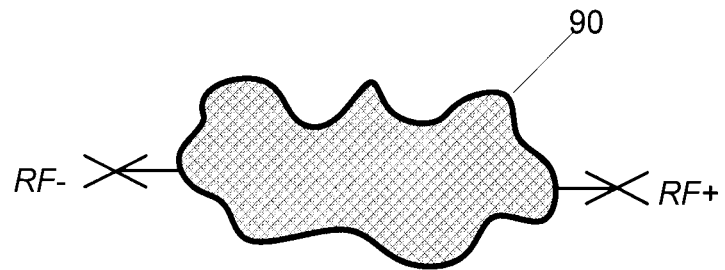
FIGS. 9A-C show various configurations of differentially-excited integrated photovoltaic cell and RF antenna assemblies.
Figure 9B:
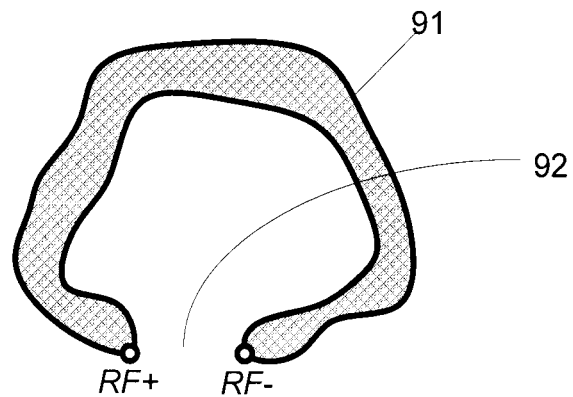
Figure 9C:
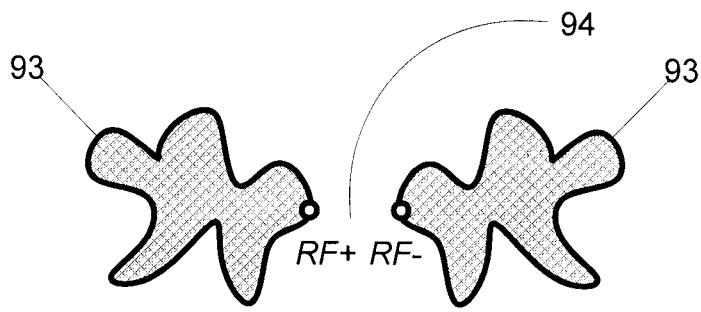

The integrated photovoltaic cell and RF antenna assembly can be RF differentially driven. Such antennas may not require an RF ground plane, which simplifies its layout structure. For instance, FIG. 9A shows a single integrated photovoltaic cell and RF antenna assembly 90 which is differentially driven at its ends. A loop integrated photovoltaic cell and RF antenna assembly 91, as shown in FIG. 9B, is also differentially driven at its ends, but a specific gap 92 must separate the two ends of the loop, which influences certain antenna RF characteristics. A loop integrated photovoltaic cell and RF antenna assembly has an inductive impedance characteristic at low frequencies (below its first resonance), whereas the monopole, dipole, and patch integrated photovoltaic cell and RF antenna assemblies have a capacitive impedance characteristic. A dipole is a differentially driven antenna, as in FIG. 9C, where two integrated photovoltaic cell and RF antenna assemblies 93 are separated by a specific gap 94. As a dipole uses at least two or more integrated photovoltaic cell and RF antenna assemblies, these can be DC connected in series or parallel in order to double the available DC power. Another embodiment may consist of a folded dipole antenna. Many RF front-end circuits, such as power amplifiers and low-noise amplifiers have a differential topology in order to suppress the common-mode noise and enhance the RF performances of the transmitted or received signal. By integrating directly to a differentially-excited antenna, a balun is not required, which decreases the component count of the transceiver system and minimizes the power loss due to the presence of the balun.

Figure 10A:
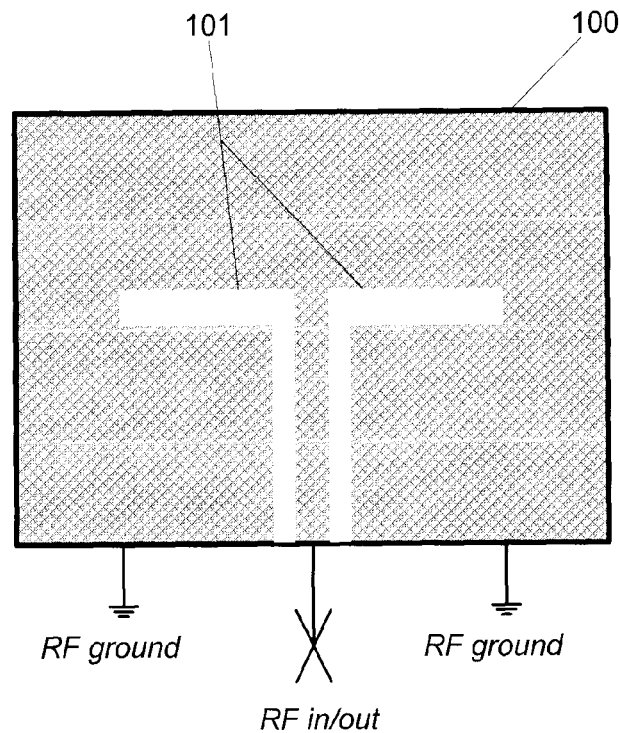
FIG. 10A shows a CPW-fed slotted dipole integrated photovoltaic cell and RF antenna assembly.

Another CPW-fed antenna topology is shown in FIG. 10A. The integrated photovoltaic cell and RF antenna assembly 100 is directly excited with a CPW feed. In this example, a slotted dipole antenna 101 resonates at a particular frequency, depending on its dimensions. Such CPW-fed integrated photovoltaic cell and RF antenna assembly may be easily integrated with an RF front-end circuit.

Figure 10B:
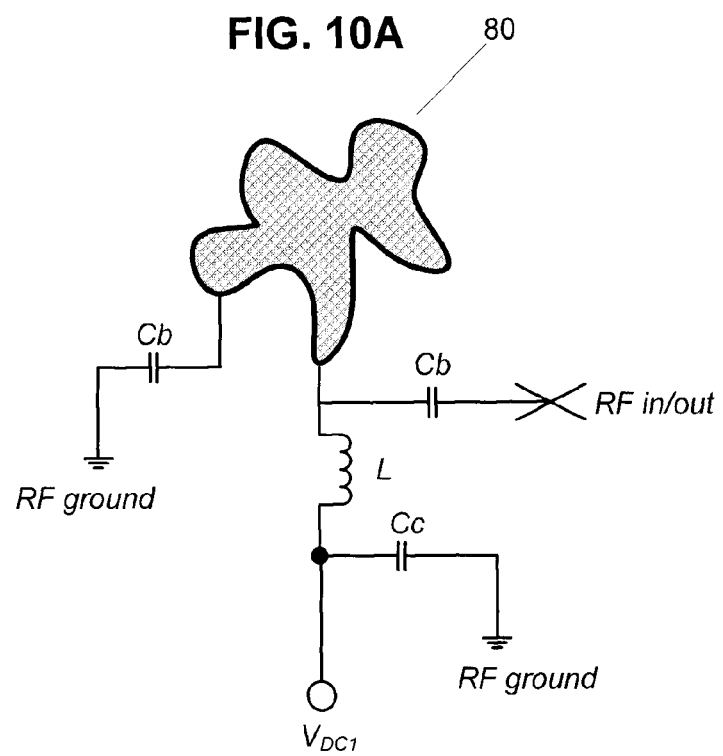
FIG. 10B shows a PIFA integrated photovoltaic cell and RF antenna assembly.

A planar inverted F antenna (PIFA) topology is shown in FIG. 10B, where the integrated photovoltaic cell and RF antenna 80 is RF excited at one point and an RF ground connects at another point. In this figure, only a single DC connection is shown. This topology may also apply to an inverted F antenna (IFA).

Other integrated photovoltaic cell and RF antenna topologies may include waveguide, horn, spiral, log-periodic, helix, Vivaldi, meander or reflector antennas.

Two or more integrated photovoltaic cell and RF antenna assemblies, as described above, may be used for antenna diversity, multiple frequency antennas, or for an antenna array, while its integrated photovoltaic cell and RF antenna assembly connected in series and/or parallel would provide for the DC power.

The integrated photovoltaic cell and RF antenna assembly may have a single polarization (such as for instance horizontal or vertical), a dual polarization (such as for instance circular or elliptical) or multiple polarizations, which depends on the shape of the antenna and its RF connection.

The integrated photovoltaic cell and RF antenna assembly, as described above, may be placed on a metamaterial (left-handed material) which changes the characteristics of the material itself, such as creating a negative electric permittivity and/or a negative magnetic permeability. Hence, the integrated photovoltaic cell and RF antenna assembly size may be reduced which is useful for low frequency applications where the overall system size constraint is an issue.

The non-conductive supporting or insulating material may be a printed circuit board, a flexible PCB, plastic or polymer, glass, paper, an organic or inorganic material, a biocompatible or biocomposite material, or a nano-material, which can be flexible and/or stretchable. The PV cells may be integrated within or on top of a textile or garment, such as clothing, bags, tents, etc. So for instance, the integrated photovoltaic cell and RF antenna assembly may be woven within a textile material to form an integrated photovoltaic cell and RF antenna assembly in the textile material. These may be used for portable or wearable applications, such as for wireless body area networks (WBAN), and may be washable.

As the integrated photovoltaic cell and RF antenna assembly may be flexible and easily integrated with other electronic devices, it may be offered as a "peel and stick" device where a thin layer of adhesive is layered on its bottom side, in case of a planar structure. It may be offered as a stand-alone device or as a complete wireless system.

Figure 11:
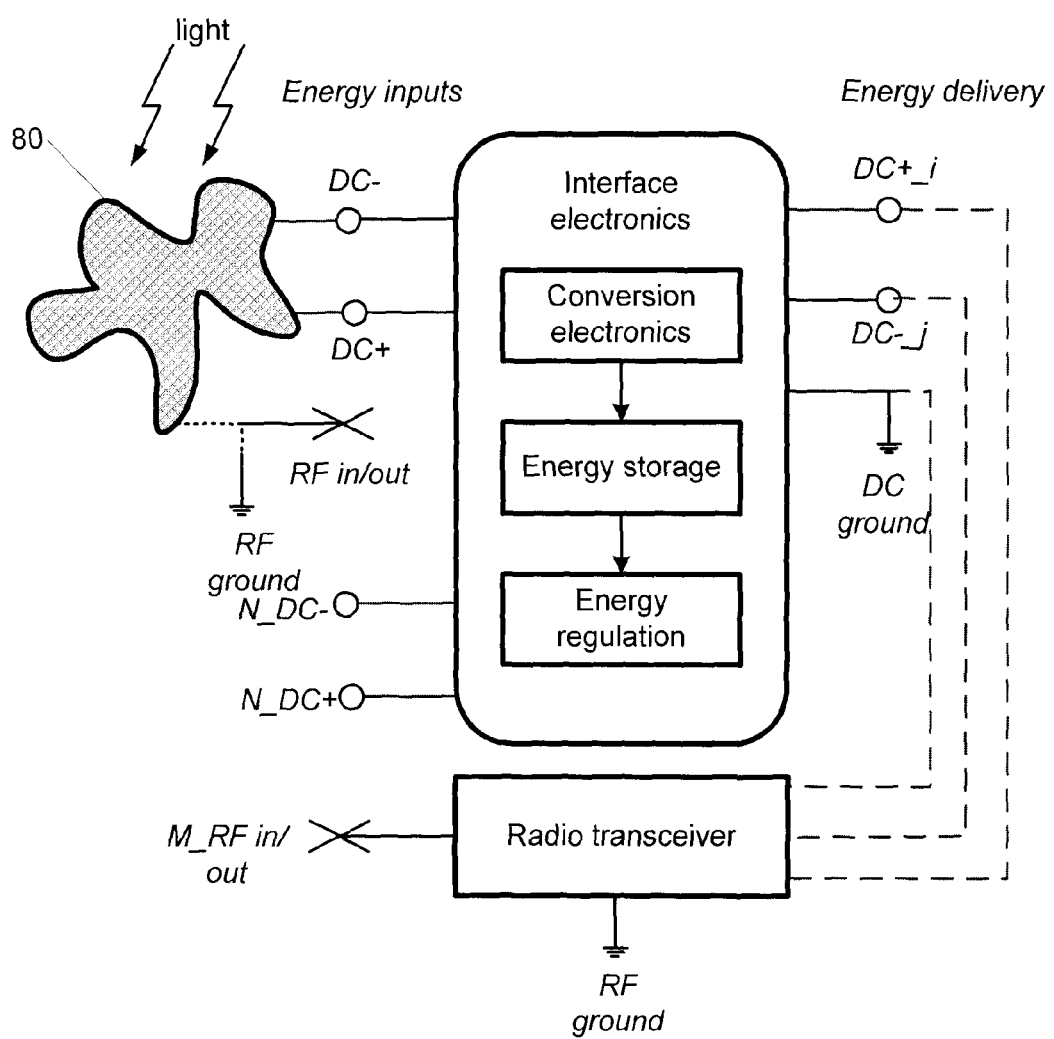
FIG. 11 is a block diagram of an embodiment of a light energy harvesting DC and RF management system which comprises an integrated photovoltaic cell and RF antenna assembly.

Referring to FIG. 11, there is shown an embodiment where the integrated photovoltaic cell and RF antenna assembly 80 and associated PV cell elements are integrated with an energy harvesting interface electronic device which contains some conversion electronics, energy storage, and energy regulation, in order to deliver a constant energy and appropriate RF and DC grounds for subsequent stages of electronics, as part of a light energy harvesting solution.

In this embodiment, the conversion electronics efficiently and effectively collects the DC energy from the N photovoltaic cells elements (N_DC+, N_DC−), by converting the collected energy into a usable energy format. The energy storage accumulates and preserves the energy. Its storage is mated with the conversion electronics in order to accept the incoming charge from the light harvester. The energy regulation circuitry then regulates the output voltage and current from the energy storage for required DC supplies for subsequent electronic devices (DC+_i, DC−_j). A DC ground is also provided. The M_RF connections and RF ground (if available) interface directly with the radio transceiver circuitry.

The integrated photovoltaic cell and RF antenna assembly may also be integrated with other printed electronic, thin-film, nanoelectronic, or organic technologies.

Figure 12A:
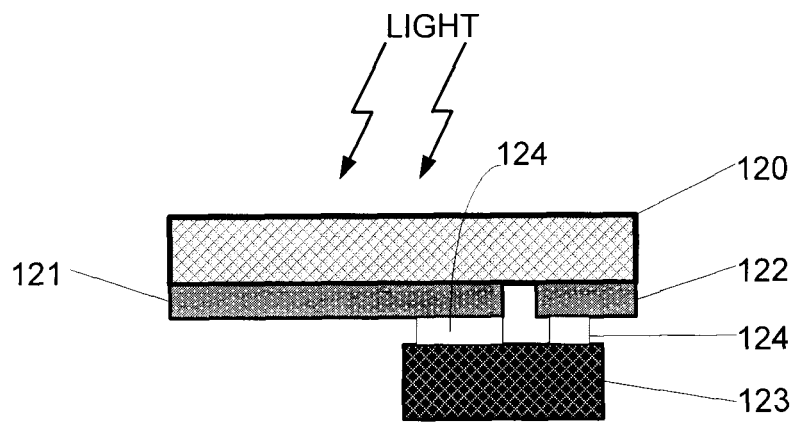
FIGS. 12A-B show cross-sections of an integrated photovoltaic cell and RF antenna assembly operatively connected with an electronic device.

For instance, in FIG. 12A, there is shown a cross-section view of an electronic device 123 connected with the integrated photovoltaic cell and RF antenna assembly via a first horizontal portion of conductive material 121 and a second horizontal portion of conductive material 122 using a conductive adhesive 124, or other means of making contact with the device 123, such as flip chip bonding. The first horizontal portion of conductive material 121 and the second horizontal portion of conductive material 122 are used for providing the RF and DC connections as mentioned earlier and are secured under the photovoltaic cell 120.

In one embodiment, the electronic device 123 may be a radio transceiver and/or power management device which includes the DC conversion interface electronics. It will be therefore appreciated by the skilled addressee that there is no need of a shielded cable.

Figure 12B:
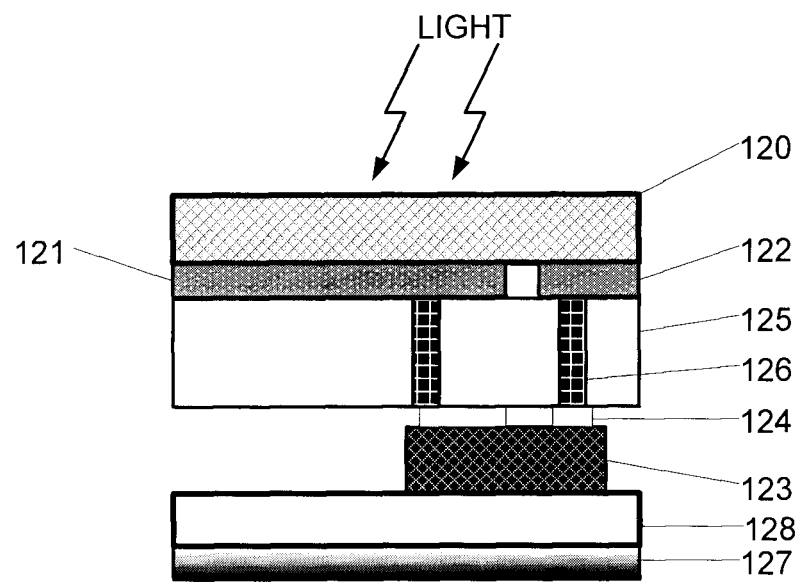

Multiple integrated photovoltaic cell and RF antenna assemblies may be interfaced directly to at least one electronic device 123. As shown in FIG. 12B, the photovoltaic cell 120, the first horizontal portion of conductive material 121 and the second horizontal portion of conductive material 122 are connected to the electronic device 123 via an insulating material 125, which can be flexible in nature. It will be appreciated that the connection to the first horizontal portion of conductive material 121 and the second horizontal portion of conductive material 122 may be made using interconnecting vias, microvias, or nanowires 126. Such configuration may be used for RF radiated coupling antenna structures, such as the one disclosed in FIG. 8E.

Still referring to FIG. 12B, a conductive reflector or metamaterial 127 may be placed a certain distance from the integrated photovoltaic cell and RF antenna assembly in order to minimize backward radiated fields. In wearable applications, the body absorbs a great part of the RF energy radiated by the antenna. Hence, the conductive reflector 127 would be advantageous in order to minimize the radiated fields inside the body and maximize the radiated field outwardly.

In one embodiment, the conductive reflector or metamaterial 127 lies directly on the backside of the electronic device 123. Alternatively, the conductive reflector or metamaterial 127 lies on the backside of a non-conductive supporting material or air 128. It will be appreciated that the electronic device 123 may also be placed on the same plane as the first horizontal portion of conductive material 121 and the second horizontal portion of conductive material 122, adjacent to the photovoltaic cell, above the insulating material 125. In these configurations, the RF decoupling network is integrated in the electronic device 123.

Figure 13:
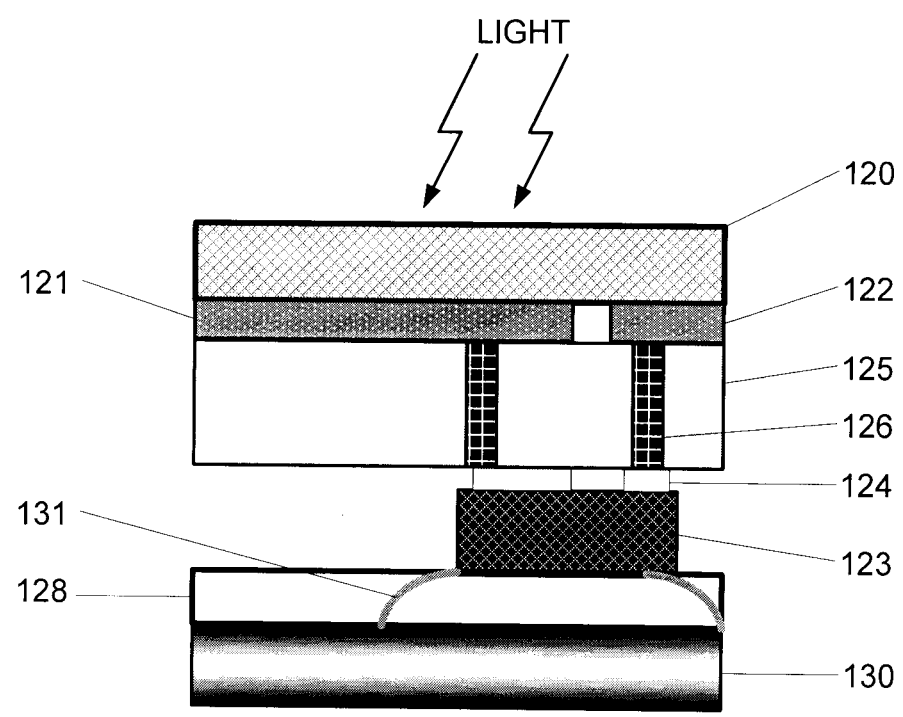
FIG. 13 shows a cross-section view of an integrated photovoltaic cell and RF antenna assembly with other electronic devices and an energy storage device.

Referring to FIG. 13 there is shown an embodiment of the integrated photovoltaic cell and RF antenna assembly operatively connected to a battery which may be rechargeable and/or a supercapacitor or other energy storage device 130, such as a fuel cell, which may be flexible, such as paper battery made of nanotube ink or carbon nanotubes.

It will be appreciated that the energy storage device 130 may be interfaced directly with the electronic device 123. Alternatively, the energy storage device 130 may be interfaced with the electronic device 123 using vias or nanowires 131.

It will be appreciated that the energy storage device 130 may be further used as an RF reflector. It will be appreciated that in one embodiment, the energy storage device 130 may be also placed adjacent to the electronic device 123. The skilled addressee will appreciate that using such an integrated system saves space and weight which is of great advantage.

Figure 14:
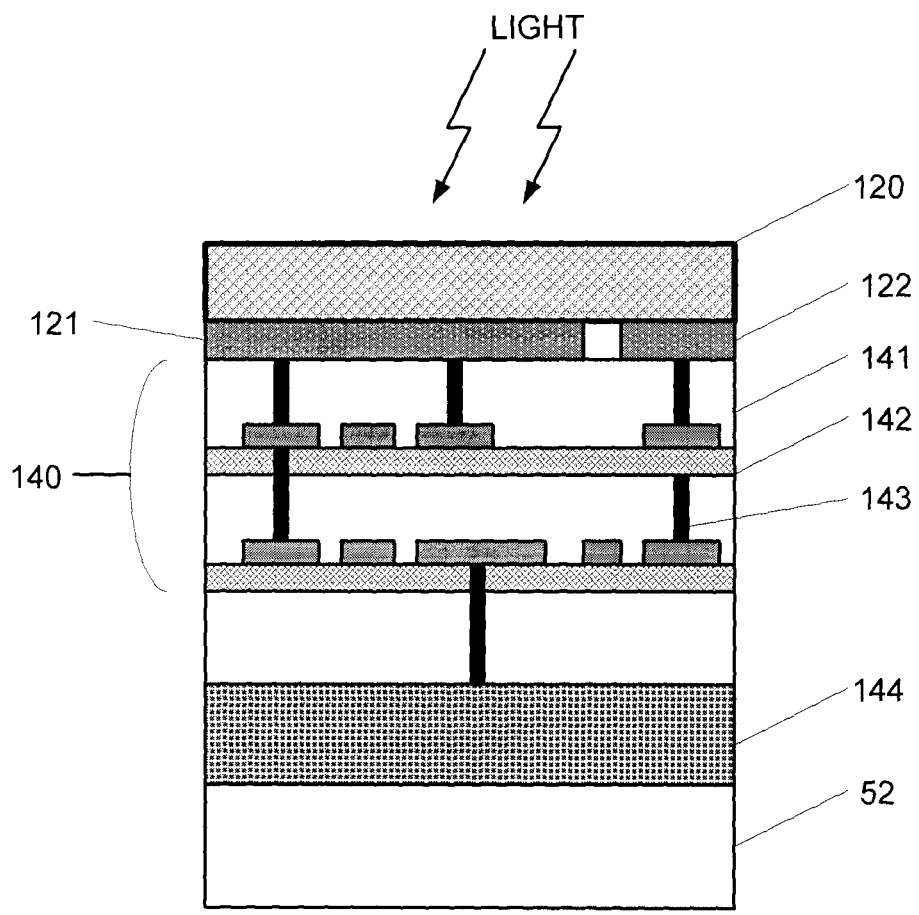
FIG. 14 shows a cross-section of a thin-film integrated photovoltaic cell and RF antenna assembly integrated with other electronic devices and energy storage devices.

Referring to FIG. 14, there is shown an example of a cross-section view of a fully integrated thin film photovoltaic cell and RF antenna assembly with other thin film technologies.

It will be appreciated that the technology may use the same photovoltaic fabrication processes, which have active devices (transistors and diodes) and passive devices (resistors, capacitors, inductors, and transformers) 140 used for other electronic functionalities, such as photodiodes and light-emitting diodes, electronic display, DC circuits, digital and analog/RF circuits.

It will be appreciated that layer 141 may be a silicon dioxide. The layer 142 may be a thin silicon film for constructing an active device, which interconnects with the first horizontal portion of conductive material 121 and the second horizontal portion of conductive material 122 of the photovoltaic cell 120, and the other underlying layers if present.

These may also be fabricated adjacent to the integrated photovoltaic cell and RF antenna assembly. Moreover, a thin film rechargeable battery and/or energy storage 144 device may be placed under the active and/or passive devices 140, interconnecting with some of these devices. It will be further appreciated that since the energy storage device 144 may be flexible in nature, it may serve as a supporting material for the integrated photovoltaic cell and RF antenna assembly wireless system.

A material 52 which may be flexible and/or stretchable in nature may be placed under the integrated photovoltaic cell and RF antenna assembly. Such highly integrated system may use an organic or inorganic process for fabricating the integrated photovoltaic cell and RF antenna assembly and the active devices.

In alternative embodiments, nanoscale devices or elements may be used, such as carbon nanotubes, graphene transistors, quantum dots, and nanowires.

In other embodiments, the integrated photovoltaic cell and RF antenna assembly may be embedded with microelectromechanical systems (MEMS) or nanoelectromechanical systems (NEMS), such as MEMS sensors, actuators, passive elements, or switches. A frequency reconfigurable integrated photovoltaic cell and RF antenna may be achieved using MEMS or NEMS switches.

Figure 15:
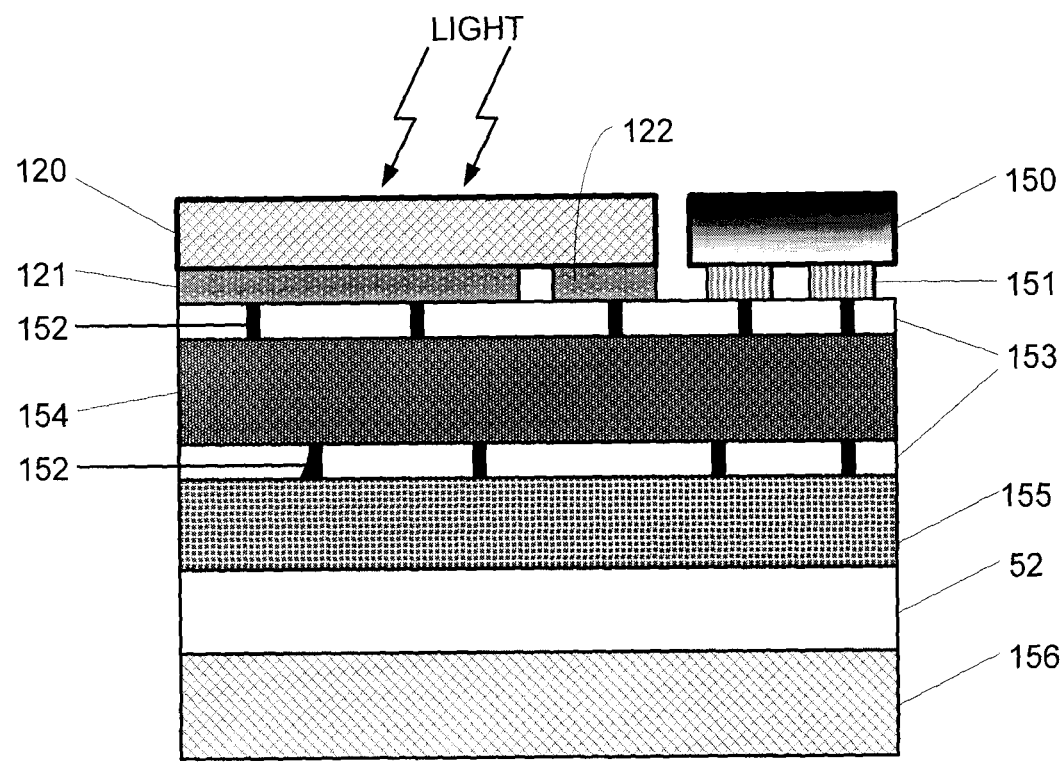
FIG. 15 shows a cross-section of an integrated photovoltaic cell and RF antenna assembly operatively connected to a thermogenerator and other electronic devices.

Referring to FIG. 15, there is shown a cross-section of the integrated photovoltaic cell and RF antenna assembly comprising the photovoltaic cell 120, the first horizontal portion of conductive material 121 and the second horizontal portion of conductive material 122 integrated with a heat energy or thermal power generator or thermogenerator 150, such as thermopiles.

It will be appreciated that the thermogenerator 150 may be used when a local temperature difference occurs, such as on-body, sun heat, or close to a device generating heat.

In this embodiment, energy is collected from both the photovoltaic cell 120 and the thermogenerator 150 and may be stored in an energy storage device 155. Hence, the overall size of the photovoltaic cell 120 may be reduced. It will be appreciated that the thermogenerator 150 may either be placed adjacent to the photovoltaic cell 120 or embedded in the photovoltaic cell 120 using a process fabrication, such as using thin film technologies.

The thermogenerator 150 interconnects via 151 with the underlying electronic devices 154. A supporting material 153 associated with some interconnects 152 may be optional, as well as the underlying material 52. A cooling system or heat sink 156 may be required in order to maintain a certain level of temperature at the backside of the integrated photovoltaic cell and RF antenna assembly/thermogenerator system.

The integrated photovoltaic cell and RF antenna assembly used for solar or light energy harvesting may also be used as the antenna for electromagnetic radiation or wireless transfer energy harvesting, thus combining both energy harvesting technologies.

Although the above description relates to a specific preferred embodiment as presently contemplated by the inventor, it will be understood that the invention in its broad aspect includes mechanical and functional equivalents of the elements described herein.

The invention claimed is:

1. An integrated photovoltaic cell and radio-frequency (RF) antenna assembly, the assembly comprising:
a photovoltaic cell;
at least two horizontal portions of conductive material, each of the at least two horizontal portions of conductive material being secured under the photovoltaic cell, wherein two of the at least two horizontal portions are used for providing an electrical potential difference and the RF antenna is provided using the photovoltaic cell and at least one of the at least two horizontal portions of conductive material.

2. The integrated photovoltaic cell and RF antenna assembly as claimed in claim 1, wherein said photovoltaic cell comprises:
a top layer;
a transparent conductive film layer secured under the top layer;
a first electrode layer secured under at least one part of the transparent conductive film layer;
a second electrode layer secured under the first electrode layer;
wherein a first horizontal portion of conductive material of the at least two horizontal portions of conductive material is secured under the transparent conductive film layer and a second horizontal portion of conductive material of the at least two horizontal portions of conductive material is secured under the second electrode layer of the photovoltaic cell.

3. The integrated photovoltaic cell and RF antenna assembly as claimed in claim 1, further comprising a low-pass filter operatively connected to the two of the at least two horizontal portions for RE decoupling the two of the at least two horizontal portions.

4. The integrated photovoltaic cell and RF antenna assembly as claimed in claim 1, wherein the photovoltaic cell comprises a slot, further comprising one of a microstripline and a stripline located between said at least two horizontal portions of conductive material and said photovoltaic cell.

5. The integrated photovoltaic cell and RF antenna assembly as claimed in claim 1, further comprising extra conductive material operatively connected to a selected horizontal portion of conductive material of the at least two horizontal portions of conductive material.

6. The integrated photovoltaic cell and RF antenna assembly as claimed in claim 5, wherein said extra conductive material is placed adjacent to the selected horizontal portion of conductive material of the at least two horizontal portions of conductive material.

7. The integrated photovoltaic cell and RE antenna assembly as claimed in claim 5, wherein said extra conductive material is placed partly underneath the selected horizontal portion of conductive material of the at least two horizontal portions of conductive material.

8. The integrated photovoltaic cell and RF antenna assembly as claimed in claim 1, wherein said integrated photovoltaic cell and RF antenna assembly comprises a plurality of photovoltaic cells.

9. The integrated photovoltaic cell and RF antenna assembly as claimed in claim 1, wherein at least one of said photovoltaic cell and said RF antenna is flexible.

10. An integrated photovoltaic cell and RF antenna assembly comprising a plurality of integrated photovoltaic cell and RF antenna assemblies as claimed in claim 1.

11. An integrated photovoltaic cell and aperture-coupled patch antenna, said integrated photovoltaic cell and aperture-coupled patch antenna comprising:
an integrated photovoltaic cell and RF antenna assembly as claimed in claim 1;
a slotted photovoltaic cell RF ground plane; and
wherein said slotted photovoltaic cell RF ground plane and said integrated photovoltaic cell and RF antenna assembly are separated by one of an insulating material and air.

12. The integrated photovoltaic cell and RF antenna assembly as claimed in claim 1, further comprising a reflector located under said integrated photovoltaic cell and RF antenna assembly.

13. An integrated photovoltaic cell and monopole antenna, said integrated photovoltaic cell and monopole antenna comprising:
an integrated photovoltaic cell and RF antenna assembly as claimed in claim 1;
a photovoltaic cell RF ground plane having an opening;
a post-like connection engaged in the opening of the photovoltaic cell RF ground plane and operatively connected to the integrated photovoltaic cell and RF antenna assembly, said post-like connection for providing at least one of RF excitation and reception.

14. A planar monopole integrated photovoltaic cell and RF antenna assembly comprising:
a supporting non-conductive material;
an integrated photovoltaic cell and RF antenna assembly as claimed in claim 1 and placed on said supporting non-conductive material;
a conducting line for providing an RF signal excitation or reception to the integrated photovoltaic cell and RF antenna assembly;
wherein photovoltaic cell and RF antenna grounds are separated from the conducting line by a determined spacing.

15. The integrated photovoltaic cell and RF antenna assembly as claimed in claim 1, further comprising a slotted antenna with CPW feed.

16. An inverted F antenna (IFA), said inverted F antenna comprising:
an integrated photovoltaic cell and RF antenna assembly as claimed in claim 1,
wherein the RF antenna is RE excited at one point and an RF ground connects at another point.

17. The integrated photovoltaic cell and RF antenna assembly as claimed in claim 1, further comprising an energy storage device for storing energy.

18. The integrated photovoltaic cell and RF antenna assembly as claimed in claim 17, wherein said energy storage device is further used as an RF reflector.

19. The integrated photovoltaic cell and RF antenna assembly as claimed in claim 1, further comprising a thermal power generator for providing energy.

* * * * *